United States Patent
Zhao et al.

(10) Patent No.: US 8,357,244 B1
(45) Date of Patent: Jan. 22, 2013

(54) METHOD FOR LIFTING OFF PHOTORESIST BENEATH AN OVERLAYER

(75) Inventors: Lijie Zhao, Pleasanton, CA (US); Wei Zhang, Fremont, CA (US); Hongping Yuan, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 332 days.

(21) Appl. No.: 12/871,747

(22) Filed: Aug. 30, 2010

Related U.S. Application Data

(62) Division of application No. 11/770,016, filed on Jun. 28, 2007.

(51) Int. Cl.
*B08B 3/10* (2006.01)
(52) U.S. Cl. ............... 134/19; 134/25.3; 134/30
(58) Field of Classification Search ............ 134/1.3, 134/19, 25.4, 30
See application file for complete search history.

(56) References Cited

U.S. PATENT DOCUMENTS

| | | | | |
|---|---|---|---|---|
| 4,456,675 A | * | 6/1984 | Anderson et al. | 430/256 |
| 5,451,295 A | * | 9/1995 | Kroll | 216/52 |

FOREIGN PATENT DOCUMENTS

| | | | |
|---|---|---|---|
| JP | 60-117625 | * | 6/1985 |
| JP | 60-117627 | * | 6/1985 |
| JP | 08-086731 | * | 4/1996 |

\* cited by examiner

*Primary Examiner* — Frankie L Stinson

(57) ABSTRACT

A method of removing photoresist beneath an overlayer includes estimating a rapid temperature change for a photoresist layer to produce cracking in the overlayer. The temperature chance is estimated so that the cracking of the overlayer is sufficient to allow a liftoff solution to penetrate below the overlayer during a liftoff step. The method further includes baking the photoresist layer and chilling the photoresist layer after baking to produce the rapid temperature change. The method then includes lifting off the photoresist layer using the liftoff solution.

10 Claims, 1 Drawing Sheet

METHOD FOR LIFTING OFF PHOTORESIST BENEATH AN OVERLAYER

CROSS-REFERENCE TO RELATED APPLICATION

This application is a divisional of U.S. patent application Ser. No. 11/770,016, filed Jun. 28, 2007, which is herein incorporated by reference in its entirety.

BACKGROUND

Photoresist layers are commonly used in the formation of particular structures on a wafer. In a typical manufacturing process using photoresist, there may be a number of steps involving deposition of layers, ion milling, etching, and numerous other processes. In particular, the use of photoresist layers in to manufacture read and/or write heads for hard disk drives may involve the formation of tiny, three-dimensional structures using photoresist. In the complicated operations used to form such structures, photoresist layers can become embedded underneath other layers deposited during formation of these structures. The deposition process may thus leave the photoresist layer covered by an overlayer that is more or less impenetrable by the liftoff solution. Accordingly, the conventional techniques for lifting off photoresist using a liftoff solution might not be successful. Sometimes other process techniques can be used to allow the liftoff solution to penetrate an upper layer, including, for example, undercutting photoresist structures. But those techniques may introduce additional complexity into the manufacturing process, which can be undesirable for a number of reasons, including difficulties in controlling the additional process steps, requirement of additional time and expense, and other associated complications.

SUMMARY

In a particular embodiment, a method of lifting off photoresist beneath an overlayer includes estimating a rapid temperature change for a photoresist layer to produce cracking in the overlayer. The temperature change is estimated so that the cracking of the overlayer is sufficient to allow a liftoff solution to penetrate below the overlayer during a liftoff step. The method further includes baking the photoresist layer and chilling the photoresist layer after baking to produce the rapid temperature change. The method then includes lifting off the photoresist layer using the liftoff solution.

In a particular embodiment, an apparatus for lifting off photoresist beneath an overlayer includes a heating device configured to heat a photoresist layer beneath an overlayer to a bake temperature. The apparatus also includes a chilling device configured to produce a rapid temperature change in the photoresist layer from the bake temperature to a lower temperature to produce cracks in the overlayer. The apparatus further includes a liftoff solution able to penetrate below the overlayer through the cracks in the overlayer produced by the rapid temperature change.

DETAILED DESCRIPTION OF THE PREFERRED EMBODIMENTS

Figure 1:
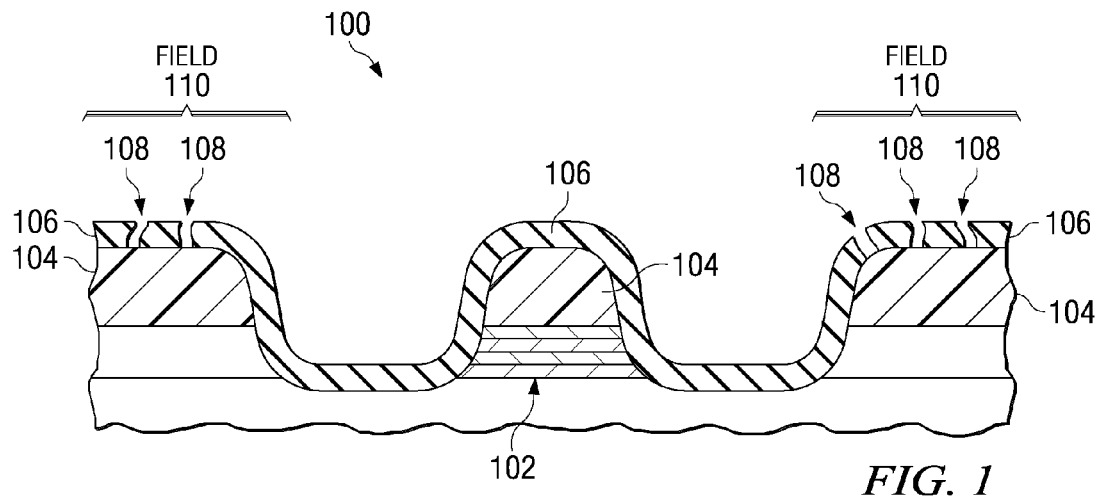
FIG. 1 illustrates a sensor for a hard disk drive manufactured according to a particular embodiment of the present invention.

FIG. 1 illustrates a sensor 100 being manufactured according to a particular embodiment of the present invention. The sensor 100 includes a sensor stack 102 with a photoresist layer 104 atop the sensor stack 102. Some distance away, which may be a few microns in a particular embodiment, from the sensor stack 102, there is a field region 110 also covered with photoresist 104. The sensor stack 102 and photoresist layer 104 are in turn covered by an overlayer 106 that effectively seals in the photoresist layer 104 both near the sensor stack 102 and the field region 110, so that liftoff solution would be substantially prevented from reaching the photoresist layer 104. The sensor 100, which is not shown to scale, is only an example for illustrative purposes, and it should be understood that the described techniques can be applied to any suitable structure formed using a photoresist layer 104 with an overlayer 106 substantially preventing the liftoff solution from reaching the photoresist layer 104. In particular embodiments, the liftoff solution may be N-methylpyrrolidone (NMP).

According to a particular embodiment, the overlayer 106 includes cracks 108 produced by differential expansion between the photoresist layer 104 and the overlayer 106. The cracks 108 are produced by heating the photoresist layer 104 during a bake step to a bake temperature, which produces a wrinkle effect in the photoresist layer 104, and then rapidly chilling the photoresist layer 104. The overlayer 106, having different thermal expansion properties, is subject to stresses by the wrinkling of the photoresist layer 104, and if the stress on the overlayer 106 is sufficient, the overlayer 106 develops substantial cracks 108. For example, there can be large amounts of photoresist 104 in the field area 110, and the cracks 108 can develop in the field area 110 to allow a liftoff solution to penetrate below the overlayer 106.

The temperature change suitable for producing cracks 108 sufficient to allow the liftoff solution to liftoff the photoresist layer 104 may be estimated in any suitable manner. For example, the temperature change can be estimated empirically by determining a liftoff success rate for a particular liftoff process applied to wafers baked without being subject to a rapid temperature change. A liftoff success rate may be suitably described in terms of a percentage of wafers in which the overlayer 106 is successfully removed from the wafer. The liftoff success rate for the same process applied to wafers baked and then subject to a rapid temperature change may then be determined and compared to the liftoff success rate without the rapid temperature change. In a particular embodiment, a rapid temperature change is deemed sufficient when a liftoff success rate that is less than 50% without the rapid temperature change reaches more than 50% with the rapid temperature change. In a preferred embodiment, the rapid temperature change is sufficient when the liftoff success rate with the rapid temperature change exceeds 90%. In another example, the temperature change may be estimated by directly observing the degree of cracking in the overlayer 106 produced by the temperature change. In yet another example, the temperature change may be estimated by modeling the thermal response of the photoresist 104 and the overlayer 106 to determine the degree of stress that will be exerted on the overlayer 106.

In any case, the temperature change applied to the photoresist layer 104 is estimated in response to the thermal properties of the photoresist layer 104 and the overlayer 106 to crack the overlayer 106 so that it is no longer substantially impermeable to the liftoff solution. In general, this may be evaluated by determining when the overlayer 106 is sufficiently cracked to allow liftoff of the photoresist layer 104 within a reasonable time based on the liftoff solution being used and the photoresist material. A typical example for the duration of a liftoff step is thirty minutes. The photoresist layer 104 may also be subject to ultrasonic vibrations during the liftoff process to expedite liftoff. Where the combination of ultrasonic vibrations and liftoff solution would ordinarily be sufficient to remove the photoresist layer 104 but for the presence of a substantially impermeable overlayer 106, this may also be a consideration in determining the estimated temperature change needed to crack the overlayer 106 sufficiently to allow liftoff of the photoresist layer 104.

Figure 2:
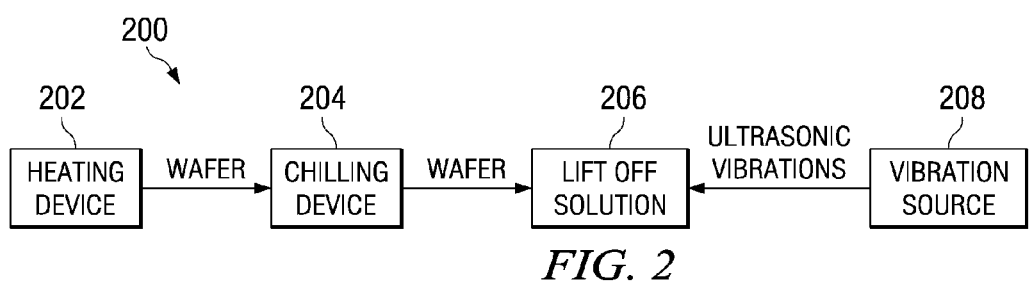
FIG. 2 is a block diagram of an apparatus for lifting off photoresist according to another embodiment of the present invention.

FIG. 2 is a block diagram of an apparatus 200 including a heating device 202, a chilling device 204, and a liftoff solution 206. The heating device 202 may be any suitable component for raising the temperature of the photoresist layer 104. Examples of heating devices 202 frequently used with photoresist process include bake chambers and heating plates. In a particular embodiment, the heating device 202 is configured to heat the photoresist layer 104 to a bake temperature of 170 degrees centigrade. The bake temperature can be suitably selected to produce thermal effects in the photoresist layer 104, such as the wrinkling described above. The duration of heating can be selected to be any appropriate time period to produce the desired change in the temperature of the photoresist layer 104. In a particular embodiment, the photoresist layer 104 is heated for fifteen minutes.

The chilling device 204 may be any suitable component for reducing the temperature of the photoresist layer 104 sufficiently rapidly to produce the estimated temperature change in the photoresist layer 104. Examples of chilling devices 204 include water-cooled chilling plates. In a particular embodiment, the chilling plate 204 is configured to remove sufficient heat from the photoresist layer 104 to chill the photoresist layer 104 from the bake temperature to room temperature (nominally 20 degree centigrade) in less than two minutes.

The liftoff solution 206 includes any suitable chemical for removing the photoresist layer 104. In a particular embodiment, the liftoff solution 206 is NMP. After the temperature change is produced by the chilling device 204, the liftoff solution 206 can penetrate the overlayer 106 sufficiently to remove the photoresist layer 104. The apparatus 200 may optionally include a source of ultrasonic vibrations 208 to which the photoresist layer 104 may be subject to facilitate liftoff of the photoresist layer 104.

Figure 3:
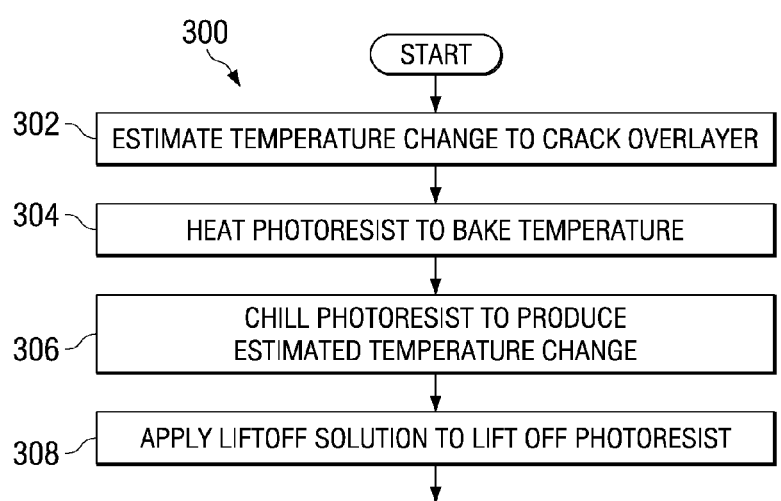
FIG. 3 is a flow chart illustrating a method for lifting off photoresist according to yet another embodiment of the present invention.

FIG. 3 is a flow chart showing an example method 300 for lifting off photoresist 104 beneath an overlayer 106. At step 302, a temperature change for the photoresist layer 104 is estimated to produce sufficient cracking in the overlayer 106 to allow a liftoff solution 206 to penetrate beneath the overlayer 106. The photoresist layer 104 is heated to a bake temperature using the appropriately configured heating device 202 at step 304. The photoresist layer 104 is then chilled using the chilling device 204 configured to produce the estimated temperature change at step 306. After the overlayer 106 is cracked by the photoresist layer 104 being subject to the estimated temperature change, the liftoff solution 206 may be applied to remove the photoresist layer 104 at step 308. Optionally, the liftoff step 308 may include applying ultrasonic vibration as well.

We claim:

1. A method of lifting off photoresist beneath an overlayer, comprising:
   estimating a rapid temperature change for a photoresist layer to produce cracking in an overlayer that is substantially impermeable to a liftoff solution, wherein the cracking of the overlayer is sufficient to allow the liftoff solution to penetrate below the overlayer;
   baking the photoresist layer;
   chilling the photoresist layer after baking to produce the rapid temperature change; and
   lifting off the photoresist layer and the overlayer using the liftoff solution.

2. The method of claim 1, wherein the photoresist layer is chilled from a bake temperature to 20 degrees Celsius in less than two minutes.

3. The method of claim 1, wherein the chilling step is performed using a water-cooled chilling plate.

4. The method of claim 1, wherein the liftoff solution is N-methylpyrrolidone (NMP).

5. The method of claim 1, wherein the rapid temperature change is estimated based on a change in liftoff success rate between a first sample of photoresist layers not subject to the chilling step after the baking step and a second sample of photoresist layers subject to the chilling step after the baking step.

6. The method of claim 1, wherein the rapid temperature change is estimated based on a sample of photoresist layers subject to the rapid temperature change, wherein a liftoff success rate for the sample of photoresist layers is at least a predetermined percentage.

7. The method of claim 6, wherein the liftoff success rate is at least 50%.

8. The method of claim 6, wherein the liftoff success rate is at least 90%.

9. The method of claim 1, wherein the step of lifting off the photoresist layer comprises applying the liftoff solution to the photoresist layer for thirty minutes.

10. The method of claim 1, wherein the step of lifting off the photoresist layer further comprises treating the photoresist layer with ultrasonic vibrations.

* * * * *